INVENTOR.
JEAN A. BAUDIN
BY
Isidore Togut
ATTORNEY

INVENTOR.
JEAN A. BAUDIN
BY [signature]
ATTORNEY 3,051,881

CHANNEL SELECTOR SERVO CIRCUIT

Jean A. Baudin, Montclair, N.J., assignor to International Telephone and Telegraph Corporation, Nutley, N.J., a corporation of Maryland Filed July 8, 1960, Ser. No. 41,594
9 Claims. (Cl. 318—29)

This invention relates to automatic tuning systems and more particularly to a channel selector servo system.

In certain radio navigations and direction finding systems which have a plurality of channels and it is desired to tune to a predetermined channel, provisions are made therein for automatic tuning means by developing a coarse error voltage for driving the tuning means to within a number of channels of the predetermined channel and further develops a fine error voltage for driving the tuning means to the predetermined channel. One such system is the Tacan radio navigation system wherein any 10 of the 126 Tacan signals may be preset after which any one of the preset 10 channels may be selected by setting a single switch knob to the corresponding positions. Several circuits in the receiver-interrogator unit of the Tacan system must be switched or re-tuned when changing channels. In order to accomplish this easily and accurately from a remote point, the actual switching and re-tuning is performed by a servo mechanism built into the receiver-interrogator. The switching circuit in the channel selector provides an electrical error signal which is applied to the servo mechanism, causing it to run until the error voltage has been reduced to approximately zero. The error signal is developed as two A.C. voltages, a coarse error voltage and a fine error voltage, which appear at the output terminal of two bridge circuits. When the bridges are unbalanced, the output voltages are approximately zero, and the the servo is at rest. When it is desired to tune to another channel, one or both of the bridges is unbalanced providing an error voltage output. The servo in the receiver-interrogator is driven by this error voltage in such a direction as to rebalance the bridge. This action also positions the tuning and switching circuits to the desired channel. When the channel selector switch of the Tacan selector unit is operated, the coarse error bridge develops the voltage which drives the tuning mechanism to within ten channels of the selected channel; the fine error bridge completes the channel selection by developing a voltage which drives the tuning mechanism to the selected channel. The bridges are balanced by positioning the potentiometer windings for zero error voltage outputs when on channel. The error signal drives a motor which in turn drives both fine and coarse potentiometers until a null is reached. Switching of the system between the coarse and the fine error signals is accomplished by means of a relay which then produces from these error signals voltages to drive the motor in the correct direction. In the Tacan airborne receiver transmitter which contains the channel selection and servo circuits described above, the circuitry is quite complex, expensive, and contains components, such as relays and vacuum tubes, which add to the weight of the equipment. In an airborne receiver-transmitter any savings that can be effectuated in both weight and size is extremely advantageous since it increases the pay load available and simplifies maintenance.

It is therefore an object of this invention to provide an improved channel selecting and servo circuit adapted for use in Tacan having simplified circuitry and utilizing components such as transistors.

Another object is to provide a channel selector circuit which will minimize interaction between coarse and fine error signals in an automatic tuning circuit.

A feature of this invention is a channel selector servo circuit for automatically tuning a radio signalling system to a predetermined channel of a plurality of channels, the radio signalling system having tuning means and means to develop a coarse error voltage for controlling the tuning means to within a predetermined number of channels of the predetermined channel and means to develop a fine error voltage for controlling said tuning means to said predetermined channel. The invention comprises means to convert the coarse error voltage and the fine error voltage to signals having corresponding waveforms, means to combine the coarse and fine error signals of corresponding waveforms and means responsive to the combined coarse and fine error signals to tune the tuning means to the predetermined channel.

Another feature is that the coarse selector servo circuit includes a mixing network for each error signal whereby the ratio of the impedance of the impedance network for the coarse signal to the impedance of the impedance network for the fine error signal determines which error signal will control the servo circuit.

The above-mentioned and other features and objects of this invention will become more apparent by reference to the following description taken in conjunction with the accompanying drawings, in which.

Figure 1:
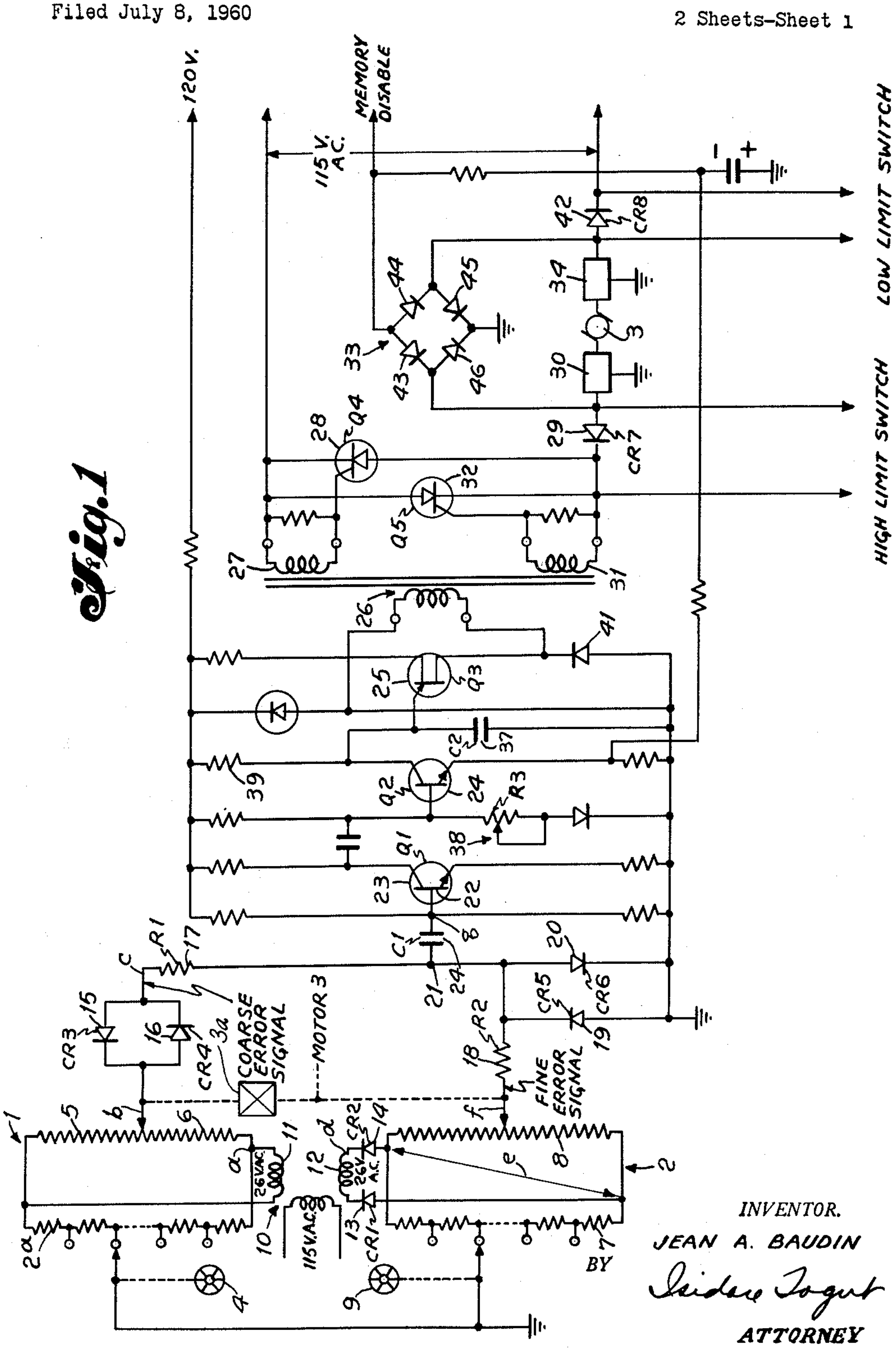
FIG. 1 is a schematic diagram embodying this invention.
Figure 2:
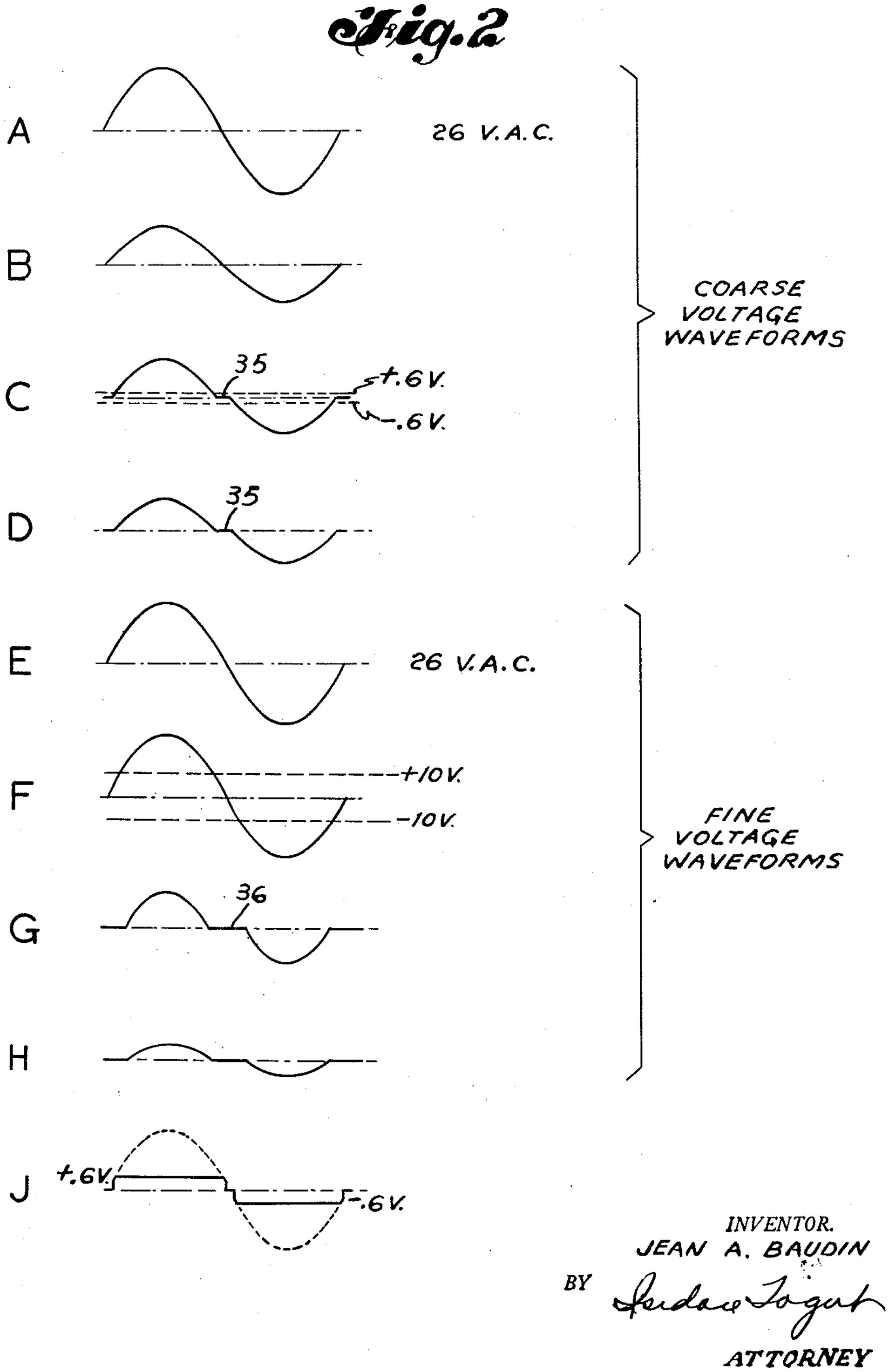
FIG. 2 is a group of waveforms useful in explaining the operation of this invention.

Referring now to FIGS. 1 and 2 there is shown two resistance bridge circuits 1 and 2 designed to produce voltages to control a channel selector servo motor 3 in a radio signalling system such as the Tacan system. The resistance bridge circuit 1 comprises a resistive switching network 2 which is manually controlled by a knob 4, and a variable potentiometer 5, the wiper arm 6 of which is movable by rotation of the motor 3. The resistance bridge circuit 2 also comprises a resistive switching network 7 and a variable potentiometer 8 rotatably controlled by the motor 3. The potentiometer 5 is controlled through a Geneva mechanism (not shown) from the shaft of the fine potentiometer 8. A knob 9 is used to switch the resistive bridge network 7 to any desired position. The resistance bridge circuit 1 is used to develop the coarse error signal. When the knob 4 is switched from one position to an adjacent position in the resistive network 2, a switching occurs of ten channels in the Tacan system. The resistance bridge circuit 2 develops the fine error signal and when there occurs a switching of the resistive network 7 from one position to an adjacent position, one channel switching occurs. The coarse and fine error signals are actually developed as two 400 cycle A.C. voltages which appear at the output terminals of the two bridge circuits. A transformer 10 connected to a source of A.C. voltage produces 26 volt A.C. across the two secondaries 11 and 12 of transformer 8. Secondary 11 is connected directly across the bridge circuit 1. Secondary 12 is coupled to bridge circuit 2 by means of Zener diodes 13 and 14. The output of potentiometer 5 is coupled to diodes 15 and 16 connected back to back and the output of the diodes 15 and 16 is coupled to a resistor 17. The fine error signal output of potentiometer 8 is coupled to resistor 18. Diodes 19 and 20 are coupled back to back to resistors 17 and 18 at junction point 21. The other terminals of the diodes 19 and 20 are coupled to ground. Junction 21 is coupled to the base 22 of a transistor 23 by a capacitor 24. The output of transistor 23 is coupled to transistor 24 and the output of transistor 24 is coupled to transistor 25. The output of transistor 25 is coupled to the primary of transformer 26. The secondary 27 of transformer 26 is coupled to the winding of motor 3 by a silicon controlled rectifier 28, a diode 29 and a filter 30. Another secondary 31 of the transformer 26 is coupled to the motor winding by a silicon controlled rectifier 32, diode 29 and filter 30. Transformer secondaries 27 and 31 are also coupled to the winding of servo motor 3 by a bridge rectifier circuit 33 and a filter 34.

Operation of this circuit is dependent on the proper mixing of coarse and fine error signals which is accomplished as follows. The error signal required for positional control is obtained from the resistance bridges 1 and 2. In the Tacan control box there are two resistive networks 2*a* and 7 which are formed from multi-contact wafer switches and precision resistors connected in series. The operating knobs 4 and 9 on the control box effectively ground one of the selected junctions in each series string. The wires connecting the ends of the resistive networks 2*a* and 7 in the control box with the ends of the corresponding potentiometers 5 and 8 are energized with 26 volts A.C. from the transformer windings 11 and 12. This configuration constitutes an A.C. bridge yielding an error signal at the arm of the potentiometer whose phase and amplitude are a function of the position of the arm. As shown, the arms for each potentiometer are mechanically coupled to the channel selecting servo motor 3. The phase of the error signal is such that the motor (through the servo circuit) will at all times turn in the direction to reduce the error signal to zero. The potentiometer 5 may be described as a decade potentiometer and is turned in steps of ten channels by means of a Geneva wheel shown diagrammatically as 3*a* connected to the units potentiometer 8. Channel selection is accomplished by first finding the null on the decade potentiometer 5 whose output is termed the coarse error signal. When this is accomplished, the units potentiometer 8 whose output is termed the fine error signal is then driven to the null position. The circuitry which operates from the error signals in the resistive bridges 1 and 2 and converts them into the necessary motor drive will now be described. Operation of this circuit is dependent upon the proper mixing of coarse and fine error signals which is accomplished as follows. Due to Geneva action in positioning the coarse error potentiometer 5, the coarse error voltage varies in six increments of 2 volts per Geneva step. Consequently, when the coarse error exists, it will be 2 volts or greater. The waveform A illustrates the 26 volts A.C. which is the output of secondary transformer winding 11 at point *a* in the resistance bridge 1. Waveform B illustrates the output of potentiometer 5 at point *b*, the amplitude of this signal varying with the setting of the potentiometer 5. Signal B is then passed through the back-to-back coupled diodes 15 and 16 which have a conduction level of approximately .6 volt to thereby provide base clipping of the signal output of potentiometer 5. This base clipping action is shown in waveform C. The base clipped waveform is shown in D with a step 35 between the two phases of the waveform. Since even a very poor null in the coarse error potentiometer 5 results in less than a few tenths of a volt of an error signal, diodes 13 and 14 effectively block this signal and prevent it from appearing at *c*. In this manner, the coarse error signal is switched "off" and operation is then switched to the fine error signal. With the fine error signal, the circuit configuration is necessarily different as will be pointed out later. The output of secondary 12 is the sine wave E, 26 volts A.C., as it appears at point *d*. The voltage secured after the sine wave *e* passes through the Zener diodes 13 and 14 is determined by the conduction of the Zener diodes 13 and 14. These diodes have a conduction level of 10 volts and effectively clip off any portion of the signal below 10 volts as shown in waveform F. The resulting waveform across the terminals of potentiometer 6 is shown in waveform G of FIG. 2 with the step 36, where no conduction occurred, connecting the two phases of waveform G. At the output of the potentiometer 8, at point *f*, there results waveform H which is similar to waveform G except that the amplitude of the wave varies with the setting of the potentiometer 8. It is thus seen that the shapes of the coarse error waveforms and the fine error waveforms are similar, both having a non-conducting step portion between the negative and positive portion of the wave. The reference voltage that is waveform E, is shaped to the waveform corresponding to the coarse error signal by Zener diodes 13 and 14 before it is fed to the resistive bridge 2 in order to maintain unchanged the impedance of the mixer circuit between points *f* and 21. The importance of this correspondence of waveform shape will be emphasized in the subsequent discussion. Resistors 17 and 18 together with diodes 19 and 20 form a resistor mixer having a mixing ratio of 390 to 2.2. For large signals diodes 19 and 20 act as voltage limiters and therefore may be considered very low in impedance. With this mixing ratio, the coarse error signal will always be larger than any fine error signal and will therefore control the channeling process. The fine error voltage appearing at the junction 21 of resistors 17 and 18 in the absence of the coarse error signal is dependent on the impedance ratio of resistor 18 and the combination of diodes 19 and 20. For large fine error signals, the impedance of diodes 19 and 20 is relatively low; for low fine error signals, the impedance of diodes 18 and 19 is very high. This property in effect increases the available error signal as the servo approaches the required null position. This non-linear action therefore increases the positional sensitivity when approaching the required null position.

The mixing scheme described above is not linear. In effect, this mixing scheme replaces the relay of the prior art Tacan which can be switched from the coarse error signal to the fine error signal in a very definite and positive fashion so that there can be no interaction of one signal to the other when the system is operating on either the coarse error signal or the fine error signal. The mixing scheme described herein uniquely switches the operation of this system from coarse error signals to fine error signals with a minimum of interaction between the two signals. Because of the diodes 15 and 16 being non-conductive below .6 volt, any coarse error signal below that amplitude will therefore not effect the operation of the system and the fine error signal will prevail. The impedance of diodes 15 and 16 in series with resistor 17 may be denoted as $R_1$ and resistor 18 may be denoted as $R_2$. The resistance of resistor 17 is 2200 ohms and that of resistor 18 is 390K ohms. Due to the characteristics of the diodes 15 and 16, conduction therethrough takes place at approximately .6 volt. Below .6 volt, the resistance of the diodes 13 and 14 is very high, in the order of 15 megohms or more and above .6 volt the resistance of the diodes steeply decreases. Therefore, in the case where the coarse voltage may be .3 volt, the ratio of $R_1$ to $R_2$ is in the nature of 15 megohms to 390K ohms. The coarse signal will be effectively blocked, and the fine signal will prevail. In the case where the coarse signal is high, that is, over .6 volt, then the resistance of the diodes 15 and 16 is very low and the ratio of $R_1$ to $R_2$ may be in the order of 2200 ohms plus a few ohms resistance offered by diodes 13 and 14 to 390k ohms of $R_2$. Therefore, in this case, the coarse error signal will predominate.

The importance of the zero step 35 in the coarse voltage waveform and the zero step 36 in the fine voltage waveform will now be explained. If the coarse voltage signal is of the nature shown in waveform D and the fine error signal were a pure sine wave and, furthermore, if the amplitude of the coarse voltage is about 2 volts and that of the fine error signal were .5 volt, then there would be no particular problem if the two voltages were in phase. If, however, the two voltages were out of phase, then the portion of a fine error sine wave signal coincident with the steps 35 would produce, first, a voltage of one phase and then a voltage of the opposite phase as sine wave crossed the zero crossing line which would tend to fire the transistor 25 and through the servo loop cause the motor 3 to operate in the fashion described as "hunting." This, of course, is undesirable since it is, in effect, a spurious signal and interferes with the proper tuning of the tuning system. By forming the fine error voltage to the same waveform shape as the coarse error voltage, that is, by providing a zero step 36 in the waveform G, the fine error signal, there will occur a coincidence of no voltages at the time of the steps even if the fine error signal is out of phase with the coarse error signal thus effectively preventing any hunting of the servo motor 3.

The back-to-back diodes 19 and 20 are used to limit the dynamic range of the input signals fed to the transistor 22 and thereby prevent overloading the transistor or even damaging it irreparably. The two diodes 19 and 20 act as peak limiters having a conduction limit of .6 volt and producing at point *g* waveform J which has a maximum amplitude of .6 volt.

The error signals appearing at the junction 21 of resistors 17 and 18 are amplified in the servo amplifier consisting of the circuits of transistors 22 and 24. The gain stabilization of this amplifier with temperature is achieved by conventional bridge biasing. The output of transistor 24 is a D.C. voltage appearing across capacitor 37. The amplified error signal, therefore, varies the D.C. voltage across capacitor 37. The sensitivity of this amplifier can be varied by potentiometer 38 which varies both the D.C. voltage and the A.C. components of the error signal appearing across capacitor 37.

Transistor 25 is a uni-junction transistor which is used in a pulse former circuit. This circuit takes advantage of a property of this semiconductor which depends on potentials set up between the two bases of this device and the emitter. If one base is connected to a voltage source and the second base is grounded, the emitter will conduct until its potential is at a particular fractional value of the voltage source. This value falls between .52 and .68 of the supply source depending on the type of uni-junction transistor used. When conduction does take place, it increases regeneratively until limited by the emitter supply. Another property of this device is that the threshold bias can be made insensitive to temperature change by placing a small resistance in series with the base connected to the source voltage. The emitter voltage on transistor 25 is set just below the conduction value by potentiometer 38 which varies the D.C. voltage appearing on capacitor 37. When an error signal appears on capacitor 37 whose positive voltage swing raises the emitter potential above the threshold value, regenerative conduction takes place, capacitor 37 is discharged and emitter conduction is quenched. Capacitor 37 is recharged through resistor 39 until conduction potential is again obtained. A train of conduction pulses, therefore, are generated in the emitter. The duration of each pulse is determined by the time constant of resistor 39 and capacitor 37, and the duration of each train is determined by the portion of the positive half cycle of the error signal exceeding the threshold bias of the emitter. The discharge of capacitor 37 takes place through the following path, the emitter of transistor 25, the primary of transformer 26 and ground. A diode 41 is used to short any negative overshoot in transformer 26. The two secondary windings 27 and 31 of transformer 26 are used to provide pulse triggers from the pulse former circuit for firing the silicon control rectifiers 28 and 32, used in the motor control circuit.

The operation of the motor control circuit is as follows. A.C. power from the same source providing coarse and fine error bridge voltage is applied to the motor winding of motor 3. In normal operation, diode 29 and a diode 42, which couples the A.C. power to a second winding of motor 3 through filter 34, are shorted by their respective limit switches (not shown), therefore, the A.C. voltage is effectively across silicon rectifiers 28 and 32 through the D.C. motor 3. The silicon control rectifiers, 28 and 32, are connected back-to-back and each can conduct only for one half cycle of the A.C. source frequency. Thus, if silicon rectifier 28 is made to conduct, current flow to the motor will be in the direction determined by the polarity of rectifier 28. If silicon rectifier 32 conducts, the current through the motor will be reversed. Thus, the direction of rotation of the motor can be controlled by controlling the conduction of silicon rectifiers 28 and 32. Conduction of silicon rectifiers 28 and 32 is dependent on the presence of triggers on the control elements of these rectifiers and in a given A.C. cycle the silicon control rectifier satisfying the following conditions will conduct: (1) it must have between its terminals the conducting half cycle of the source frequency, while (2) in the same half cycle triggers from the pulse former are present on its control electrode. Since the generation of triggers during any particular half cycle of the source frequency is dependent on the phase of the error voltage and since conduction of a particular silicon rectifier is dependent on the time coincidence of triggers in the operating half cycle of the motor voltage, direction of motor rotation is dependent only on the phase of the error signal. Proper phasing in this system will then cause the motor to turn in the direction which will reduce the magnitude of the error signal to zero. The portion of the conducting half cycle applied to the motor is dependent on the position of the first pulse in the pulse former. Thus, for large error signals the conducting half cycle produces pulses in transistor 25 near the beginning of the half cycle. When the error signal is small, conduction in transistor 25 may occur only at the peak of the error signal. In a similar manner, conduction in the corresponding silicon control rectifier takes place in virtually the full half cycle for high error signals and the conduction reduces to nearly half of the cycle when the error signal is small. This, in effect, provides proportional speed control as the servo approaches the required position and obtains the advantage of having high motor speed for long distance channeling and low motor speed for accurate positioning without hunting. Diodes 43, 44, 45, and 46 form a bridge rectifier circuit which provides the negative D.C. voltage during channeling. This voltage is used to disable the range memory (not shown), disable the transmitter, and provide D.C. feedback in the servo amplifier to stabilize servo loop gain. Filters 30 and 34 prevent RF frequencies from entering into the motor 3.

This circuit has been reduced to practice with the following parameters.

| | |
|---|---|
| C1 | Capacitor, 68$\mu$f. (tantalum). |
| C2 | Capacitor, .047$\mu$f. |
| CR1 | Diode, Zener, 10 volts. |
| CR2 | do. |
| CR3 | Diode, 1N459. |
| CR4 | do. |
| CR5 | do. |
| CR6 | do. |
| CR7 | Diode, 1N645. |
| CR8 | Diode, 1N648. |
| CR9 | Diode, 1N459. |
| Q1 | Transistor, 2N336. |
| Q2 | do. |
| Q3 | Transistor, 2N490. |
| Q4 | Silicon rectifier, TI 132. |
| Q5 | do. |
| R1 | Resistor, 22K ohms. |
| R2 | Resistor, 390K ohms. |
| R3 | Resistor, variable, 50K ohms. |

While I have described above the principles of my invention in connection with specific apparatus, it is to be clearly understood that this description is made only by way of example and not as a limitation to the scope of my invention as set forth in the objects thereof and in the accompanying claims.

I claim:

1. A channel selector servo circuit for automatically tuning a channel selector to a predetermined channel of a plurality of channels, said channel selector having coarse and fine channel selection means, comprising means including a reference voltage and responsive to said channel selection means to develop a coarse error voltage for controlling said channel selector within a predetermined number of channels of the predetermined channel, means including said reference voltage and responsive to said fine channel selection means to develop a fine error voltage for controlling said channel selector to said predetermined channel, means to convert said coarse error voltage and said fine error voltage to signals having corresponding waveforms and means responsive to said combined coarse and fine error signals to tune said channel selector to said predetermined channel, said means to develop said coarse error signals comprising first and second diodes, each of said diodes having an anode and a cathode, means coupling the anode of said first diode to the cathode of said second diode, means coupling said coarse error voltage to said cathode of said first diode and said anode of said second diode, whereby the output of said first and second diode is said coarse error signal of said corresponding waveform having a sinusoidal shape with a step of zero voltage connecting the two phases of said waveform.

2. A channel selector servo circuit according to claim 1 wherein said means to deveop said fine error signal comprises diode means to convert said reference voltage to said corresponding waveform whereby said fine error signal of corresponding waveform is produced from said converted reference signal, said fine error signal of corresponding waveform having a sinusoidal shape with a step of zero voltage connecting the two phases of said waveform.

3. A channel selector servo circuit according to claim 2 wherein said means to combine said coarse and fine error signals of corresponding waveforms comprise a first resistor in series with said first and second diodes, a second resistor, means coupling said fine error voltage of said corresponding waveform to said second resistor, means coupling said first resistor to said second resistor whereby the ratio of the sum of the impedance of said first and second diodes and the resistance of said first resistor to the resistance of said second resistor determines which error signal controls the servo circuit.

4. A channel selector servo circuit for automatically tuning a channel selector to a predetermined channel of a plurality of channels, said channel selector having coarse and fine channel selection means, comprising means including a reference voltage to develop a coarse error voltage for controlling said channel selector within a predetermined number of channels of the predetermined channel, means including said reference voltage to develop a fine error voltage for controlling said channel selector to said predetermined channel, means to convert said coarse error voltage and said fine error voltage to corresponding waveforms having sinusoidal shapes and stepped functions, means to combine said coarse and fine error signals of corresponding waveforms and means responsive to said combined coarse and fine error signals to tune said channel selector to said predetermined channel.

5. A channel selector servo circuit for automatically tuning a channel selector to a predetermined channel of a plurality of channels, said channel selector having coarse and fine channel selection means and a motor for driving said channel selection means, comprising means including a reference voltage and responsive to said coarse channel selection means to develop a coarse error voltage for controlling said channel selector within a predetermined number of channels of the predetermined channel, means to produce from said coarse error voltage a coarse error signal, the waveform of which has sinusoidal shapes and step functions, a first resistor, means coupling said coarse error signal to said first resistor means to produce from said reference voltages a reference signal wherein the waveform has sinusoidal shapes and step functions, a resistive bridge network, means coupling said reference signal to said resistive bridge network and responsive to said five channel selection means to produce at the output of said resistive bridge network a fine error signal having a corresponding waveform to said coarse error signal of sinusoidal shapes and step functions, a second resistor, means coupling said fine error signal to said second resistor, means coupling said first resistor to said second resistor whereby the ratio of the sum of the impedances of said first and second diodes and the resistance of said first resistor to the resistance of said second resistor determines which error signal controls at the junction of said first and second resistors, amplifying means, means coupling the junction of said first and second resistors to said amplifying means, a pulse forming circuit, means coupling the output of said amplifying circuit to said pulse forming circuit, a motor controlling circuit, means coupling the output of said pulse forming circuit to said motor controlling circuit whereby the direction of rotation of said motor is controlled by the output of said motor controlling circuit in accordance with the phase of the error signal produced at the junction of said first and second resistors and thereby drives said coarse channel selection, means within a predetermined number of channels of the predetermined channel when said coarse error signal controls said motor control circuit and drives said fine channel selection means to said predetermined channel when said fine error signal controls said motor control circuit.

6. A channel selector servo circuit for automatically tuning a channel selector to a predetermined channel of a plurality of channels, said channel selector having coarse and fine channel selection means and a motor for driving said channel selection means, comprising means including a reference voltage and responsive to said coarse channel selection means to develop a coarse error voltage for controlling said channel selector within a predetermined number of channels of the predetermined channel, first rectifier means, means coupling said coarse error voltage to said first rectifier means whereby there is produced at the output of said first rectifier means a coarse error signal, the waveform of which has sinusoidal shapes and step functions, a first resistor coupled to the output of said first rectifier means, second rectifier means, means coupling said reference voltage to said second rectifier means whereby there is produced at the output of said second rectifier means a reference signal wherein the waveform has sinusoidal shapes and step functions, a resistive bridge network, means coupling said reference signal to said resistive bridge network and responsive to said fine channel selection means to produce at the output of said resistive bridge network a fine error signal having a corresponding waveform to said coarse error signal of sinusoidal shapes and step functions, a second resistor, means coupling said fine error signal to said second resistor, means coupling said first resistor to said second resistor whereby the ratio of the sum of the impedances of said first rectifier means and the resistance of said first resistor to the resistance of said second resistor determines which error signal controls at the junction of said first and second resistors, amplifying means, means coupling the junction of said first and second resistors to said amplifying means, a pulse forming circuit, means coupling the output of said amplifying circuit to said pulse forming circuit, a motor controlling circuit, means coupling the output of said pulse forming circuit to said motor controlling circuit whereby the direction of rotation of said motor is controlled by the output of said motor controlling circuit in accordance with the phase of the error signal produced at the junction of said first and second resistors and thereby drives said channel selector within a predetermined number of channels of the predetermined channel when said coarse error signal controls said motor control circuit and drives said channel selector to said predetermined channel when said fine error signal controls said motor control circuit.

7. A channel selector servo circuit for automatically tuning a channel selector to a predetermined channel of a plurality of channels, said channel selector having coarse and fine channel selection means and a motor for driving said channel selection means, comprising means including a reference voltage to develop a coarse error voltage for controlling said channel selector within a predetermined number of channels of the predetermined channel, first rectifier means, means coupling said coarse error voltage to said first rectifier means whereby there is produced at the output of said first rectifier means a coarse error signal, the waveform of which has sinusoidal shapes and step functions, a first resistor coupled to the output of said first rectifier means, second rectifier means, means coupling said reference voltage to said second rectifier means whereby there is produced at the output of said second rectifier means a reference signal wherein the waveform has sinusoidal shapes and step functions, a resistive bridge network, means coupling said reference signal to said resistive bridge network to produce at the output of said resistive bridge network a fine error signal having a corresponding waveform to said coarse error signal of sinusoidal shapes and step functions, a second resistor, means coupling said fine error signal to said second resistor, means coupling said first resistor to said second resistor whereby the ratio of the sum of the impedances of said first rectifier means and the resistance of said first resistor to the resistance of said second resistor determines which error signal controls at the junction of said first and second resistors, first and second diodes coupled back-to-back and coupled to the junction of said first and second resistors, means coupling said first and second diodes to ground whereby the amplitude of the error signals appearing at the junction of said first and second resistors is limited in accordance with the characteristics of said first and second diodes, amplifying means, means coupling the junction of said first and second resistors to said amplifying means, a pulse forming circuit, means coupling the output of said amplifying circuit to said pulse forming circuit, a motor controlling circuit, means coupling the output of said pulse forming circuit to said motor controlling circuit whereby the direction of rotation of said motor is controlled by the output of said motor controlling circuit in accordance with the phase of the error signal produced at the junction of said first and second resistors and thereby drives said channel select means within a predetermined number of channels of the predetermined channel when said coarse error signal controls said motor control circuit and drives said channel select means to said predetermined channel when said fine error signal controls said motor control circuit.

8. A channel selector servo circuit for automatically tuning a channel selector to a predetermined channel of a plurality of signals, said channel selector having coarse and fine channel selection means and a motor for driving said channel selection means, comprising means including a reference voltage to develop a coarse error voltage for controlling said channel selector within a predetermined number of channels of the predetermined channel, first rectifier means, means coupling said coarse error voltage to said first rectifier, means whereby there is produced at the output of said first rectifier means a coarse error signal, the waveform of which has sinusoidal shapes and step functions, a first resistor coupled to the output of said first rectifier means, second rectifier means, means coupling said reference voltage to said second rectifier means whereby there is produced at the output of said second rectifier means a reference signal wherein the waveform has sinusoidal shapes and step functions, a resistive bridge network, means coupling said reference signal to said resistive bridge network to produce at the output of said resistive bridge network a fine error signal having a corresponding waveform to said coarse error signal of sinusoidal shapes and step functions, a second resistor, means coupling said fine error signal to said second resistor, means coupling said first resistor to said second resistor whereby the ratio of the sum of the impedances of said first rectifier means and the resistance of said first resistor to the resistance of said second resistor determines which error signal controls at the junction of said first and second resistors, first and second diodes coupled back to back and coupled to the junction of said first and second resistors, means coupling said first and second diodes to ground whereby the amplitude of the error signals appearing at the junction of said first and second resistors is limited in accordance with the characteristics of said first and second diodes, amplifying means, means coupling the junction of said first and second resistors to said amplifying means, a pulse forming circuit, means coupling the output of said amplifying circuit to said pulse forming circuit, a motor controlling circuit, means coupling the output of said pulse forming circuit to said motor controlling circuit whereby the direction of rotation of said motor is controlled by the output of said motor controlling circuit in accordance with the phase of the error signal produced at the junction of said first and second resistors and thereby drives said coarse channel selection means within a predetermined number of channels of the predetermined channel when said coarse error signal controls said motor control circuit and drives said fine channel selection means to said predetermined channel when said fine error signal controls said motor control circuit.

9. A channel selector servo circuit for automatically tuning a channel selector to a predetermined channel of a plurality of signals, said channel selector having coarse and fine channel selection means and a motor for driving said channel selection means, comprising means including a reference voltage to develop a coarse error voltage for controlling said channel selector within a predetermined number of channels of the predetermined channel, first and second diodes coupled back to back, means coupling said coarse error voltage to the input of said first and second diodes whereby there is produced at the output of said first and second diodes a coarse error signal, the waveform of which has sinusoidal shapes and step functions, a first resistor coupled to the output of said first and second diodes, third and fourth diodes, means coupling said reference voltage to said third and fourth diodes whereby there is produced at the output of said third and fourth diodes a reference signal wherein the waveform has sinusoidal shapes and step functions, a resistive bridge network, means coupling said reference signal to said resistive bridge network to produce at the output of said resistive bridge network a fine error signal having a corresponding waveform to said coarse error signal of sinusoidal shapes and step functions, a second resistor, means coupling said fine error signal to said second resistor, means coupling said first resistor to said second resistor whereby the ratio of the sum of the impedances of said first and second diodes and the resistance of said first resistor to the resistance of said second resistor determines which error signal controls at the junction of said first and second resistors, fifth and sixth diodes coupled back to back and coupled to the junction of said first and second resistors, means coupling said fifth and sixth diodes to ground whereby the amplitude of the error signals appearing at the junction of said first and second resistors is limited in accordance with the characteristics of said fifth and sixth diodes, amplifying means, means coupling the junction of said first and second resistors to said amplifying means, a pulse forming circuit, means coupling the output of said amplifying circuit to said pulse forming circuit, a motor controlling circuit, means coupling the output of said pulse forming circuit to said motor controlling circuit whereby the direction of rotation of said motor is controlled by the output of said motor controlling circuit in accrdance with the phase of the error signal produced at the junction of said first and second resistors and thereby drives said channel select means within a predetermined number of channels of the predetermined channel when said coarse error signal controls said motor control circuit and drives said channel select means to said predetermined channel when said fine error signal controls said motor control circuit.

References Cited in the file of this patent

UNITED STATES PATENTS

| | | |
|---|---|---|
| 2,020,275 | Beers | Nov. 5, 1935 |
| 2,446,532 | Edwards | Aug. 10, 1948 |
| 2,455,364 | Hays | Dec. 7, 1948 |
| 2,511,863 | McCoy | June 20, 1950 |
| 2,561,654 | Eller | July 24, 1951 |
| 2,715,703 | Shuck | Aug. 16, 1955 |
| 2,848,670 | Kelling et al. | Aug. 19, 1958 |
| 2,943,249 | Hemphill | June 28, 1960 |
| 2,939,061 | Keenan | May 31, 1960 |